US005707780A

United States Patent [19]
Lawton et al.

[11] Patent Number: 5,707,780
[45] Date of Patent: Jan. 13, 1998

[54] PHOTOHARDENABLE EPOXY COMPOSITION

[75] Inventors: John Alan Lawton, Landenberg, Pa.; William John Nebe; Glen Anthony Thommes, both of Wilmington, Del.; Jonathan V. Caspar, Greenville, Del.

[73] Assignee: E. I. Du Pont de Nemours and Company, Wilmington, Del.

[21] Appl. No.: 612,509

[22] Filed: Mar. 7, 1996

Related U.S. Application Data

[62] Division of Ser. No. 476,482, Jun. 7, 1995, abandoned.

[51] Int. Cl.⁶ .................. G03F 7/028; G03F 7/26
[52] U.S. Cl. ............ 430/280.1; 430/269; 430/945; 522/2; 522/170; 264/401
[58] Field of Search .................. 430/945, 280.1, 430/269; 522/2, 170; 264/401

[56] References Cited

U.S. PATENT DOCUMENTS

| Re. 29,131 | 2/1977 | Smith et al. | 260/77.5 AN |
|---|---|---|---|
| 3,450,613 | 6/1969 | Steinberg | 204/159.15 |
| 4,026,705 | 5/1977 | Crivello et al. | 96/27 R |
| 4,069,054 | 1/1978 | Smith | 96/115 P |
| 4,113,895 | 9/1978 | Watt et al. | 427/44 |
| 4,138,255 | 2/1979 | Crivello | 96/35.1 |
| 4,156,035 | 5/1978 | Tsao et al. | 427/44 |
| 4,173,476 | 11/1979 | Smith et al. | 430/280 |
| 4,245,029 | 1/1981 | Crivello | 430/280 |
| 4,250,053 | 2/1981 | Smith | 252/426 |
| 4,291,114 | 9/1981 | Berggren et al. | 430/253 |
| 4,442,197 | 4/1984 | Crivello et al. | 430/280 |
| 4,504,374 | 3/1985 | Lewarchik et al. | 204/181 C |
| 4,624,912 | 11/1986 | Zweifel et al. | 430/258 |
| 4,668,601 | 5/1987 | Kistner | 430/162 |
| 4,694,029 | 9/1987 | Land | 522/8 |
| 5,055,439 | 10/1991 | Allen et al. | 502/158 |
| 5,059,512 | 10/1991 | Babich et al. | 430/280.1 |
| 5,182,056 | 1/1993 | Spence | 264/22 |
| 5,384,339 | 1/1995 | Starkey | 522/3 |
| 5,476,748 | 12/1995 | Steinmann et al. | 430/269 |
| 5,573,889 | 11/1996 | Hofman et al. | 430/285.1 |

FOREIGN PATENT DOCUMENTS

| 2111718 | 12/1993 | Canada | G03F 7/028 |
|---|---|---|---|
| 0 360 869 A1 | 2/1989 | European Pat. Off. | C08G 59/68 |

OTHER PUBLICATIONS

Kubisen et al, Chemical Abstracts, vol. 104, Entry: 150835, p. 99, year 1986, Abstract of Radcure '84, Conf. Proc; 8th (1984), May 22—May 31.

*Primary Examiner*—Cynthia Hamilton

[57] ABSTRACT

A photohardenable composition especially suitable for use in solid imaging. The compositions are characterized by their improved photospeed in combined with excellent initial green strength. The compositions allows for the production of articles by solid imaging processing techniques that show little or no distortion, high accuracy, excellent clarity. The compositions are low in toxicity and have low sensitivity to water.

2 Claims, No Drawings

PHOTOHARDENABLE EPOXY COMPOSITION

This is a division of application Ser. No. 08/476,482, filed Jun. 7, 1995, now abandoned.

This invention relates to photohardenable compositions especially suitable for use in solid imaging. The compositions are formulated to control the diffusion such that the photo-generated initiators of the polymerization are contained within the exposed region improving the accuracy and resolution of imaged articles while at the same time improving the photospeed of the composition and the initial green strength of the imaged article.

BACKGROUND OF THE INVENTION

A solid imaging process is one wherein photohardenable materials are polymerized layer by layer in an imagewise fashion. Generally the imaged region, that is that region exposed to actinic radiation, is required to harden to such an extent that it can withstand disturbing forces such as shear forces without significant distortion or damage. In most current liquid based solid imaging systems, for example the process described in U.S. Pat. No. 5,006,364 to Fan; a doctor blade is used to distribute and smooth the photohardenable liquid on top of a platform, a support structure, or a previously imaged region. If the image region is insufficiently hardened or has poor initial green strength; it may be easily distorted by the force and movement of the doctor blade. Unsupported imaged regions, for example cantilevered layers and bridging layers between supports or other parts of an imaged article are of particular concern since these regions represent outer edges of the imaged article, and any deformation of these layers may result in a loss in tolerance of the article.

Epoxy based photohardenable compositions are capable of producing articles having exceptionally high modulus; however, the modulus usually takes longer to develop after exposure when compared with, for example, acrylate photohardenable compositions. It is possible to speed-up the modulus development of epoxy photohardenable compositions by mixing into the epoxy composition free radical polymerizable compounds such as acrylates or vinyl compounds; but if the acrylic matrix causes the imaged region to vitrify too quickly, the imaged layer formed from such a mixed resin composition may actually have lower initial green strength and possibly even lower final part strength than that of a layer or complete article formed from the more slowly curing epoxy only composition. It has been found that only certain formulations of mixed free radical and cationically polymerizable monomers compositions provide proper control of the rate and degree of cross-linking short of vitrification and therefore diffusion within the exposed region of the photohardenable composition and lead to an optimum balance which affords high initial green strength, high article green strength, and high article final strength.

An object of the present invention is to provide a precisely formulated and blended mix of epoxy and acrylic monomers, prepolymers and oligomers to control the diffusion of the activated photoinitiators such that these activated species are concentrated in the imaged region increasing the control of polymerization reaction so as to improve initial green strength and image resolution. The precise formulation relates to the proper selection and concentration of the epoxy and acrylic species that are blended into the photohardenable composition.

Another objective of the present invention is to control the initiation of polymerization throughout the exposed region and thus control the depth of exposure by selection and formulation of the photoinitiators to provide activity at at least two of the wavelengths of activation radiation provided by the radiation source.

Another objective of the present invention is to provide a photohardenable composition optimized for use with the argon ion laser.

Another objective of the present invention is to provide a photohardenable composition that is tolerant to the presence of water and to provide a composition that shows little or no variation in initial green strength of imaged regions or of cure rate as a result of the relative humidities of work areas that are 50% or even higher.

Another object of the present invention is to provide a method by which an article having high initial green strength and high image resolution can be produced by solid imaging techniques.

SUMMARY OF THE INVENTION

The present invention provides a photohardenable epoxy composition formulated to improve initial green strength of articles formed from said composition by solid imaging techniques. The composition comprises a mixture of cationically polymerizable organic substances combined with a blend of free radical polymerizable organic substances, a photo-generating acid precursor optionally associated with a sensitizer, a free radical initiator and optionally water.

The composition can further comprise water. The concentration of water is from 0.2 to 3% by weight based on the total weight of the composition.

The composition further comprises a photo-generating acid precursor and a free radical photo-initiator in combination optimized for use with a multi-wavelengths exposure source having at least two major wavelength. The initiator and the precursor are characterized by optical molar extinction coefficients. The combination is such that a normalized ratio of the extinction coefficients of, the precursor and the initiator at one major wavelength is less than a factor of 3.0 of the ratio of extinction coefficient at a second major wavelength and more preferably less than a factor of 2.

A method is also provided for fabrication of an integral three dimensional article having improved green strength by controlling the diffusion of photoactivated molecular species in the regions of a photohardenable liquid composition exposed to actinic radiation. The method comprising the steps of:

(a) forming a layer of the photohardenable liquid composition;

(b) imagewise exposing areas of at least a portion of the layers to actinic radiation;

(c) introducing a new layer of liquid on to the layer previously exposed imagewise in step (b);

(d) imagewise exposing at least a portion of the new liquid layer to actinic radiation, with the requirement that the photohardenable composition is a mixture of a cationically polymerizable material combined with a blend of free radical polymerizable organic substances, a photo-generating acid precursor optionally associated with a sensitizer, a free radical initiator and optionally water wherein the blend of free radical polymerizable organic substance has at least one mono-functional acrylic monomer and at least one multi-functional monomer; the concentration of the mono-functional monomer being at least from 0.12 to 0.9 parts by weight that of the multi-functional monomer.

DETAILED DESCRIPTION

For solid imaging applications, the photohardenable compositions based on epoxy resins are preferred since epoxy compositions yield solid objects exhibiting high accuracy and good physical properties. However, epoxy compositions typically have slow photospeeds, particularly when compared to acrylic or vinyl ether based compositions. The long cure time and slow rate of green strength development of epoxy resins result in extended production times for imaged articles. Often the wait time between the application of one layer on the next may be required to be as long as 70 seconds after exposure in order to allow unsupported regions of an imaged layer to become strong enough to withstand the stress associated with the application of subsequent layers.

In order to improve photospeed of solid imaging compositions, acrylic monomers or oligomers along with free radical initiators or vinyl ethers have been added to epoxy based compositions. Although the addition of these materials improves the photospeed of such a composition, these mixed resin composition suffer from loss of initial green strength and in some cases loss of image accuracy. To achieve satisfactory initial green strength, accuracy of image and high resolution; it is necessary to select resins having specific properties, to properly control the concentrations of the resins in the mixed composition and to properly select the photoinitiators and their concentrations such that the polymerization results in a high initial green strength within the imaged region. It is the proper selection of the resins, resin concentration and the resin concentration ratios that result in the containment of the reactive products within the imaged region while allowing the polymerization to proceed at a rate that gives good initial green strength. For example, upon exposure of a photo-generating acid precursor such as triarylsulfonium salt, a Lewis acid is generated which is capable of polymerizing the epoxy functional resins. If the diffusion of this photo-generated acid within the photohardenable liquid is faster than the rate of polymerization, then the acid escapes from the exposed region. Since the acid concentration is now lower in the exposed region, the polymerization rate of the epoxy is reduced allowing still more photo-generated acid to diffuse out of the exposed region. The result is often a layer of very low initial green strength and poor image resolution. Also since photo-generated acid that has diffused out of the image region will initiate epoxy polymerization, the pot life of the composition will be shortened. In order to reduce the diffusion of the acid from the image region after exposure, an acrylate, such as trimethylolpropane triacrylate (TMPTA), is commonly added to the epoxy photohardenable composition. Although upon exposure, the triarylsulfonium salt forms free radicals capable of inducing the polymerization of the acrylate, a free radical initiator, such as for example 1-hydroxycyclohexyl phenyl ketone (Irgacure 184 available from Ciba-Giegy), is commonly used in the formulation to boost the free radical concentration during exposure of the imaged region. Upon exposure, the acrylate quickly polymerizes and forms a lightly cross-linked matrix which serves to significantly slow the diffusion of the photo-generated acid from the image region. Since the diffusion rate of the acid from the image region is reduced, the acid concentration in the image region remains high and the polymerization rate of the epoxy in the image region is enhanced. While the addition of TMPTA and a free radical initiator in the epoxy photohardenable composition significantly improves the image resolution of the layer and also facilitates the polymerization of the epoxy initially due to containment of the photo-generated acid, too high a cross-link density of the acrylate is also capable of slowing the acid and the epoxy diffusion within the image region. With high cross-link densities of the acrylate, the initial green strength of the layer may actually be reduced or lower than that necessary to prevent layer deformation during deposition of subsequent layers. In addition, the green strength of an article or even the final strength of the article is often lower.

Proper cross-linking density is essential to achieve initial green strength and the desired image resolution. In the present invention a multi-functional acrylic monomer is added to a mixture of epoxy functional resins. The cross-link density of the acrylic component is controlled by blending into the composition a mono-functional acrylate in addition to the multi-functional acrylate. The mono-acrylate and triacrylate concentrations and relative concentrations are formulated so as to control the formation of an acrylate matrix in the imaged regions in a way that reduces acid diffusion out of the image region while allowing diffusion within the image region such that the epoxy polymerization proceeds efficiently and imaged layers develop high initial green strength while the imaged article develops both high green and final strength. The ratio of mono-acrylate monomer to triacrylate (or other multi-functional acrylate monomer) varies depending on a number of factors, such as for example, the viscosity of the remainder of the epoxy composition, the speed of polymerization of the remainder of the epoxy composition, the concentration of free radicals formed and their effect on the crosslink density of the acrylate matrix, the concentration of Lewis acid formed during exposure, etc. However, it is preferred to have the mono-acrylate/triacrylate ratio between 0.12 and 0.9 in order to achieve the greater polymerization and therefore greater initial green strength. However, due to the loss of photospeed a mono-acrylate/triacrylate ratio range of between 0.27 and 0.58 is more preferred. The reduction in photospeed is illustrated in Example 1. As used herein the terms mono-functional and multi-functional in reference to the acrylic component of the composition define the number of acrylic functional groups in the respective monomer.

Many of the various monoacrylates, such as for example, tetrahydrofurfuryl acrylate, isobornyl acrylate, and lauryl acrylate can be used to decrease the cross-link density. Most preferred however is caprolactone acrylate due to the hydroxyl functionality and low skin irritation.

It is often advantageous to include a slow to moderately fast reacting epoxy resin, in the photohardenable composition. It is believed that the slower reacting epoxy aids in interlayer adhesion and allows for a reduction in stress due, for example, to thermal variations from the layer polymerization exotherms and to shrinkage of the mixture during polymerization. Current epoxy\acrylate compositions generally include 1,4-butanediol diglycidyl ether for these purposes. 1,4-Butanediol diglycidyl ether is a low viscosity epoxy liquid with a moderately fast cure rate. The mixing of a slow to moderately fast reacting but higher viscosity epoxy resin in a composition containing a relatively fast reacting epoxy such as a cycloaliphatic epoxy, as is provided by the present invention, substantially improves the initial green strength of imaged layers as well as provides excellent interlayer adhesion and relaxation of stress during article manufacture. The inclusion of higher viscosity epoxy functional resins also significantly improves image resolution. Higher viscosity epoxy functional resins include for example, epoxy phenolic novolac resins with average functionality of approximately 3.6 or more, such as for example EPON 1050 (available from Shell), or for example epoxy cresol novolacs such as ECN 1273, 1280, or 9495 (available from Ciba). The preferred viscosity range for this slow curing epoxy is above 1000 poise at 25° C. However, it is more preferred to use a slow curing epoxy with a viscosity above 1000 poise at 25° C. and a softening point below 40° C. The mixture of the epoxy functional resins is formulated such that the slow to moderate reacting, high viscosity epoxy is present at a level of from 5 to 25% by weight of the epoxy mixture in the composition.

The initial green strength of such a mixed epoxy appears to be improved by the following mechanism. The phenolic novolac epoxies are fairly high viscosity at room temperature and have a taffy-like character. Their viscosity at 52° C. is generally above 200 poise. When mixed with other low viscosity epoxies, such as for example cycloaliphatic epoxies and/or with low viscosity acrylates, the viscosity of the resulting formulation is substantially reduced, since the high viscosity epoxy is substantially plasticized by the low viscosity liquids. When these mixtures, which further comprise a photo-generating acid precursor and/or a free radical photo initiator, are exposed, the acrylate and/or cycloaliphatic epoxies quickly polymerize, in effect convert from low viscosity liquids to solids, and are no longer capable of plasticizing the high viscosity liquid. In fact, the high viscosity epoxy, which takes longer to polymerize, now becomes the plasticizer for the solidifying cycloaliphatic epoxy and/or the acrylate. This role reversal, wherein the role of the plasticizer and plasticized components in the resin reverse, is B responsible for a surprising increase in initial green strength since the hardened cycloaliphatic and/or acrylate remain plasticized by a high viscosity liquid which imparts a substantial stiffness to the curing layer. However, since the high viscosity epoxy is still substantially a liquid, there is still mobility within the matrix to allow further polymerization even at room temperature. With epoxies that are solid at room temperature or which have a softening point above 32° C., such as for example the epoxy cresol novolacs mentioned above, the polymerization at room temperature is somewhat retarded as the faster curing components in the mix polymerize. These solid epoxies produce layers with fairly high initial green strength but since the room or process temperature cure is slowed, the part green strength is sometimes lower and the article may achieve high final strength only with a thermal cure. With the use of epoxies having a viscosity below 1000 poise at 25° C. the stiffening advantage that occurs due to the role reversal upon exposure is lost and the resulting layer has lower initial green strength.

In a dual-cure photohardenable composition having a photo-generating acid precursor and a photo-activated free radical initiator, such as the epoxy/acrylate composition of the present invention; the ratio of the light absorption of the photo-generating acid precursor to that of photo-activated free radical initiator as well as the subsequent concentration of free radicals and photo-generated acid is also important in controlling the diffusion characteristics of the reactants after exposure. Certain conditions may arise, especially in multi-wavelength exposure systems, where the concentration of the photo-generated acid is very high at the surface of the imaged region but significantly reduced in concentration deeper into the exposed layer. At the same time, the concentration of free radicals produced by the exposure, and therefore subsequently the crosslink density of the acrylate matrix, may not have the same distribution of relative concentrations through the depth of the exposed layer as that of the acid. A composition may be easily optimized in terms of initiator concentration for a single wavelength, for example such that the cross-link density of the acrylate matrix is open enough to allow faster epoxy polymerization within the imaged region yet still prevent significant diffusion of the photo-generated acid out of the imaged region. However, at other wavelengths produced by the radiation source, this same composition may on exposure react producing a greater cross-link density of the acrylate matrix and a lower concentration of photo-generated acid. This difference in relative activities of the photo initiators at different wavelengths seems to be related primarily to the absorption characteristics of the photo initiators and their competition for the available activating radiation. Therefore, at a second wavelength for which the activities of the photoinitiators has not been optimized, the polymerization of the epoxy is slowed by two factors, lower rate of diffusion of photo-generated acid and epoxy resin within the imaged region and lower photo-generated acid concentration. On the other hand, if the choice of free radical initiator combined with the available activating radiation yield a open and poorly cross-linked acrylate matrix but at the same time provides efficient production of the photo-generated acid, the photo-generated acid concentration will be high, and there will be a greater tendency for the acid to diffuse out of the image region since it is more free to diffuse out of the open, poorly crosslinked matrix and the concentration gradient of the photo-generated acid is high.

For example, when using an Argon Ion laser in the UV, the predominant wavelengths are 333.6 nm (334) (with approximately 15–20% of the energy), 351.1 nm (351)(with approximately 40% of the energy), and 363.8 nm (364)(with approximately 40% of the energy). Of these wavelengths, the 351 and 364 nm wavelengths are considered to be major wavelengths for the purpose of the instant invention. Referring to Example 4, Table 4, the molar extinction coefficients of two free radical initiators, 1-hydroxycyclohexyl phenyl ketone, (Irgacure 184, available from Ciba) and 4-(2-hydroxyethoxy)phenyl-(2-propyl)ketone Irgacure 2959, available from Ciba), and one photo-generating acid precursor, mixed triarylsulfonium hexafluoroantimonate salts (UVI-6974, available from Union Carbide), are shown. The approximate molar extinction coefficient (1/cm-mole) is given for each material in methanol or ethanol. (The UVI-6974 is a 50% solution of photo-generating acid precursor salt and propylene carbonate. The extinction coefficient of the salt is shown in Table 4.). If a ratio of the free radical photoinitiator to the photo-generating acid precursor extinction coefficients are taken for each wavelength and then these ratios are normalized by a factor about one major wavelength, for example 351 nm, and this same factor is used for the extinction coefficient ratios at the other wavelength, a comparison between initiator performance can be made.

For example in the Table 4 in Example 4 presented below, the 351 nm normalized ratio extinction coefficient at 364 nm for Irgacure 184 is much higher than that of Irgacure 2959. This means that if a formulation is optimized to produce a free radical polymerized matrix with adequate acid concentration such that a cationically polymerized resin can be hardened in a short period of time (i.e. such that it has high initial green strength), this same formulation will have a highly free radical polymerized matrix with a weak acid concentration when exposed with 364 nm light (i.e. it will have weak green strength) in the ratios between 351 nm and 364 nm for Irgacure 2959 are not so large. This provides a more balanced formulation with respect to the free radical generation and the acid generation when the formulation is exposed to multiple wavelengths from an exposure source. It is preferred to have a free radical to photo-generating acid precursor normalized extinction coefficient ratio at at least two major wavelengths of the exposure source less than 3. However, it is more preferred to have the ratio less than 2.

With a sensitizer, which allows greater photoacid generation using energy from the 364 nm wavelength, the relatively small loss of acid production with respect to free radical production can be made up with a moderately efficient sensitizer such as 1,6-diphenyl-1,3,5-hexatriene or 1,8-diphenyl-1,3,5,7-octatetraene when, for example a low normalized extinction coefficient ratio initiator such as Irgacure 2959 is used. It has been found that a very efficient sensitizer, for example 1,12-benzoperylene is capable of making up for a high normalized extinction coefficient ratio, such as that produced when using Irgacure 184, since the acid production realized by the benzoperylene sensitization of the UVI-6974 at 364 nm is quite good.

The typical recommendation for using the current liquid photohardenable compositions is to avoid humidity if at all possible, but certainly to avoid levels of humidity in the solid imaging work areas where the resin compositions are in contact with ambient air where the humidity is in excess in excess of 50% relative humidity. In normal practice, the epoxy formulation would be supplied to a customer in an essentially dry condition. If the customer's relative humidity is higher, the composition will begin to equilibrate to the higher humidity under use conditions. Since humidity changes in the composition cause a significant change in the composition's performance, especially in it's ability to achieve high initial green strength; this equilibration process will induce a significant variation that the customer must constantly compensate for in order to attempt to achieve the best performance. The composition of the present invention, however, has been adjusted to achieve higher initial green strength at relative humidities above 40%.

Part of this formulation adjustment calls for the addition of water to the formulation such that it is substantially equilibrated to the higher humidities when first supplied to the customer. Alternatively of course, the customer could be requested to add a recommended amount of water in order to match the customers relative humidity as a way to substantially equilibrate the formulation to the customer's use conditions.

A second part of this formulation adjustment for higher humidity is to lower the concentration of polyol in the formulation. The concentration of polyol is adjusted for two reasons. First, both the polyol and the water act as chain transfer agents in the epoxy formulation. These chain transfer agents have a significant effect on the initial green strength capability of the formulation. If more water is added then less polyol is needed for the proper amount of chain transfer to achieve high initial green strength. Secondly, since polyols are typically hydrophilic or hydroscopic, the more polyol there is in the composition the greater the amount of change of equilibrium water content as a function relative humidity. This larger amount of change in water content as a function of relative humidity causes a greater variation in initial green strength performance. Conversely stated, a lower polyol content causes the epoxy formulation to have a greater latitude for good initial green strength performance despite variations of relative humidity in the use environment.

The inventors have determined two ways to test for the proper polyol and water concentrations in order to achieve high initial green strength for a given epoxy formulation. In general, it is necessary to perform this testing under the relative humidity conditions that are expected to be found during use. Also, it is necessary to determine the exposure parameters for the formulation and determine the exposure necessary to produce a layer that is typically used by the customer in the process.

The first method is to expose the surface of the epoxy formulation with light in a manner similar to the exposure method used in the process of use. This will form a layer of material which can be removed from the surface of the formulation. After a set period of time, for example one and a half minutes, a formulator can touch the layer and feel its stiffness or watch its tendency to retain shape if it is deformed. By comparing various water and polyol content formulations, it is possible to identify the formulations that have the best initial green strength.

A second method of determining the best polyol and water content is to monitor the temperature or exotherm of the exposed layer over a period of time starting from the time of exposure to, for example, the first minute and a half. The formulation that has the highest area under the temperature or exotherm vs. time curve typically has a higher initial green strength.

It has been found that epoxy formulations which have a low peak temperature or exotherm after exposure tend to have a broader high temperature or exotherm over a longer period of time. These formulations also tend to achieve higher initial green strength, article green strength, and article final strength. It has also been found that the tactile test of initial green strength often compliments the thermal test for initial green strength when all other components in the composition are held constant.

Finally, once a polyol and water content formulation range is determined, it is necessary to place the formulations under the relative humidity conditions that they will be exposed to under use. By monitoring the weight gain or loss of the formulation over time it can be determined if the composition is equilibrated to the relative humidity. Small adjustments of the polyol and water content can be made to ensure that the formulation is equilibrated to the relative humidity of the use environment. An epoxy to polyol equivalent weight ratio of approximately 3.5 and a water content of approximately 0.75% was found to be the best combination for mixtures, such as those shown in Example 5, for use in a room humidity range of 40 to 80% relative humidity. With this combination, the mixture was immediately equilibrated to the humidity range and exhibited excellent initial green strength, article green strength and article part strength. In the photohardenable compositions shown in Example 5, the water content added to the composition may be as high as 1.5% for high humidity conditions, but for other compositions, such as those containing 1,4-butanediol diglycidyl ether, which adds in itself hydrophylicity; it may be necessary to add as much as 3% water to the composition in order to immediately equilibrate the composition to high humidity conditions.

If a lower relative humidity range is desired, it is best to lower the equivalent weight ratio of epoxy to polyol to between 2 and 3.5 and decrease the water content to around 0.25 to 0.75%. If higher relative humidity ranges are desired, it is best to increase the equivalent weight ratio of epoxy to polyol above 3.5 and increase the water content above 0.75%. This is the best combination for mixtures used at a room humidity range of approximately 40 to 80% relative humidity. In the photohardenable compositions of the present invention although the water content described above is preferred, water may be present up to a concentration of 3% by weight of the composition without incurring problems in cure that reported for current formulations in use in solid imaging.

Using the photohardenable composition of the present invention provides a method to produce solid imaged articles having improved initial green strength and improved image resolution. U.S. Pat. No. 5,014,207 to Lawton describes equipment and processes adapted to produce articles and to produce a controlled exposure within the image region with the formulations of the present invention.

The method comprises the following steps:
(a) forming a layer of the photohardenable liquid composition;
(b) imagewise exposing areas of at least a portion of the layers to actinic radiation;
(c) introducing a new layer of liquid on to the layer previously exposed imagewise in step (b);
(d) imagewise exposing at least a portion of the new liquid layer to actinic radiation, with the requirement that the photohardenable composition is a mixture of a cationically polymerizable material combined with a blend of free radical polymerizable organic substances, a photogenerating acid precursor optionally associated with a sensitizer, a free radical initiator and optionally water. The mixture of cationically polymerizable organic substance has at least two epoxy functional resins and the blend of free radical polymerizable organic substances has at least one mono-functional acrylic monomer and at least one multi-functional acrylic monomer. The concentration of the mono-functional monomer being at least from 0.12 to 0.9 parts by weight and more preferably from 0.27 to 0.58 parts by weight that of the concentration of the multi-functional monomer. The ratio of the weight of the mixture of the cationically polymerizable organic substances compared to the weight of the blend of the free radical polymerizable organic substances is from 3 to 10. The epoxy functional resins are selected such that one polymerizes at a slower rate than the others and so that one has a neat viscosity of at least 1000 poise at 25° C. It is more preferable that the neat viscosity of the slower curing epoxy be greater than 1000 poise at 25° C., but that the epoxy have a softening point that is less than 40° C. The slower polymerizing more viscous epoxy functional resin constitutes from 5–25% by weight of the epoxy mixture.

In accounting for the percent by weight for the free radical polymerization and the cationic polymerization components, the following distinctions were made: Those components with only ethylenic unsaturation were calculated on a full weight basis as part of the free radical or acrylic component in the formulation. Those components with only epoxy functionality or terminated by hydroxyl end groups were calculated on a full weight basis as a part of the cationic or epoxy component of the formulation. Those components with hydroxyl termination and ethylenic unsaturation, such as caprolactone acrylate, and those components with hydroxyl termination and free radical generating capability such as the free radical initiators IR-184 and IR-2959 were derided on a 50% weight basis between the two polymerization components. The photo-generating acid precursors and the sensitizers were considered part of the cationic polymerization component. Water was considered part of the epoxy component.

As used herein the term major wavelength means a wavelenght that provides at least more than 15% of the total energy distribution of the source. The argon ion laser has three major wavelengths, 334, 351 and 364 nm.

EXAMPLES

Example 1

The following example illustrates the effect of the presence of a mono-acrylate on the cure of the epoxy composition.

To determine the proper exposure required, samples having the compositions as shown in Table 1 were mixed and then poured into petri-dishes and exposed with a beam from an argon-ion laser operating with the wavelengths of 333, 351, and 364 nm. The exposures were made in half-inch squares which were scanned out by drawing consecutive parallel lines approximately 0.002 inches apart on the surface of the liquid in the petri-dish. The spot diameter at the liquid surface was approximately 0.0127 cm in diameter ($1/e^2$). After waiting at least 15 minutes for the exposed squares to harden, the thickness of each square was measured with spring loaded calipers (Absolute Digimatic Calipers, Mitutoyo, Japan). The exposure parameters $E_c$ and $D_p$ were then calculated using methods well known in the solid imaging art. In general the thickness values varied from 0.0057 to 0.0514 inches. The Ln(Exposure) versus Depth of Polymerization curve was generally linear within the measurement range. The value of $E_{10}$ is the energy necessary to form a layer approximately 0.01 inches thick. The $E_{10}$ value increases as more mono-acrylate in introduced into the composition. The triacrylate/mono-acrylate ratio is a simple ratio of the percents within each composition.

Once the exposure parameters were determined, each sample was scanned over a one inch region such that each received an exposure necessary to produce a layer thickness of 0.01 inches. During the scanning and for several minutes after the surface temperature of the exposed region was measured with a Linear Laboratories Model C-600 E Infrared Thermometer. The sensor head of this thermometer was positioned to measure the temperature of the surface of the scanned layer approximately ¾ inch in diameter. The signal emitted by this sensor was then recorded by a chart recorder calibrated to provide one division per °C. The chart recorder was run at 1 cm per minute during each exposure. This method of temperature measurement does not provide adiabatic quality data, however, it has proven very useful for determining the relative degree of polymerization over time between various compositions. The area under the curve for approximately 1.6 minutes for each sample was calculated. The results are shown in the Equal Thick temperature/time area. This value relates to the degree of polymerization that occurred within the exposed region. The higher the value the greater the degree of polymerization. In general it is noted that the polymerization was greater for the samples with higher mono-acrylate/triacrylate ratios within the first 1.6 minutes. However, that the greater temp/time area is due to the higher exposures given to the samples with higher mono-acrylate/triacrylate ratios.

For this reason, an equal exposure series of tests were run. Using the same equipment for monitoring and recording the temperature over time of the exposed samples, each sample was scanned with an equal exposure of approximately 62.44 mJ/cm² over a 1 inch square area. The peak temperatures of each mixture only varied by 1°–2° C. The temperature/time area for each of these equal exposures is show in Table 1 for the various mono-acrylate/triacrylate ratio compositions. The general trend is that the higher the ratio the greater the degree of polymerization within the first 1.6 minutes. This is true despite the fact that in general the thickness of the lower ratio layers is greater than the higher ratio layers.

In the final entry in Table 1, the temperature/time area per cubic centimeter is calculated. The volume is a calculated value based upon the 1 square inch exposure and the predicted thickness of the layer. In general it is noted that the higher ratio samples have a greater degree of polymerization per volume of polymerized region within the first 1.6 minutes of exposure.

TABLE 1

| Composition by Weight | Mix % | Mix % | Mix % | Mix % | Mix % |
|---|---|---|---|---|---|
| Cyracure Resin UVR-6105 | 76.15 | 76.15 | 76.15 | 76.15 | 76.15 |
| Irgacure 2959 | 2.70 | 2.70 | 2.70 | 2.70 | 2.70 |
| Trimethylolpropane Triacrylate | 19.00 | 17.00 | 15.00 | 12.00 | 10.00 |
| Caprolactone Acrylate | 0.00 | 2.00 | 4.00 | 7.00 | 9.00 |
| UVI-6974 | 2.15 | 2.15 | 2.15 | 2.15 | 2.15 |
| Total | 100.00 | 100.00 | 100.00 | 100.00 | 100.00 |
| Wavelength Exposure Range | 333/364 | 333/364 | 333/364 | 333/364 | 333/364 |
| Ec (mJ/cm$^2$) | 25.83 | 29.07 | 26.48 | 28.41 | 26.82 |
| Dp (mils) | 13.44 | 13.58 | 12.72 | 11.81 | 10.09 |
| E$_{10}$ (mJ/cm$^2$) | 54.40 | 60.7 | 58.1 | 66.30 | 72.2 |
| Mono-acrylate/Triacrylate Ratio | 0 | 0.12 | 0.27 | 058 | 0.90 |
| Equal Thick. Temp\Time Area | 51 | 60 | 60 | 65 | 67 |
| Equal Exp. Temp\Time Area | 59 | 61 | 62 | 60 | 64 |
| Temp\Time Area per Cubic Cm. | 768 | 909 | 882 | 1000 | 1167 |

Table 2 shows the same series of tests substituting tetrahydrofurfuryl acrylate for caprolactone acrylate in the same proportions. Following are the results:

TABLE 2

| Composition | Mix % | Mix % | Mix % | Mix % | Mix % |
|---|---|---|---|---|---|
| Cyracure Resin UVR-6105 | 76.15 | 76.15 | 76.15 | 76.15 | 76.15 |
| Irgacure 2959 | 2.70 | 2.70 | 2.70 | 2.70 | 2.70 |
| Trimethylolpropane Triacrylate | 19.00 | 17.00 | 15.00 | 12.00 | 10.00 |
| Tetrahydrofurfuryl Acrylate | 0.00 | 2.00 | 4.00 | 7.00 | 9.00 |
| UVI-6974 | 2.15 | 2.15 | 2.15 | 2.15 | 2.15 |
| Total | 100.00 | 100.00 | 100.00 | 100.00 | 100.00 |
| Wavelength Exposure Range | 333/364 | 333/364 | 333/364 | 333/364 | 333/364 |
| Ec | 27.95 | 27.48 | 27.67 | 27.65 | 26.33 |
| Dp | 15.11 | 12.34 | 11.81 | 10.83 | 7.80 |
| E10 | 54.17 | 61.81 | 64.55 | 69.65 | 94.96 |
| Mono-acrylate/Triacrylate Ratio | 0 | 0.12 | 0.27 | 0.58 | 0.90 |
| Equal Thick. Temp\Time Area | 62 | 68 | 68 | 65 | 78 |
| Equal Exp. Temp\Time Area | 74 | 82 | 78 | 68 | 78 |
| Temp\Time Area Per Cubic Cm. | 775 | 1033 | 1033 | 1187 | 1493 |

The example above shows the same general trend that higher mono-acrylate/triacrylate ratios leads to greater polymerization within the first 1.6 minutes after exposure. In general however, the higher ratio samples using tetrahydrofurfuryl acrylate had lower peak exotherms. While the higher ratio compositions exhibited greater polymerization during the first 1.6 minutes after exposure, they also showed a reduction in photospeed.

Example 2

Following are some example formulations exhibiting various slower curing epoxies in an epoxy-triol composition. The slow cure epoxy (18% in each example) is identified at the top of each column. Heloxy® 67 is a diglycidyl ether of 1,4-butanediol (available from Shell). It has a viscosity of 13–18 cps at 25° C. DEN 431 is an epoxy phenolic novolac resin (available from Dow). It has a viscosity of approximately 40,000 cps at 25° C. EPON HPT® 1050 is also an epoxy phenolic novolac resin (available from Shell). It is a taffy-like liquid at room temperature (if the surface of the resin is distorted, it will flatten to a smooth surface in hours or days) having a viscosity over approximately 5,000,000 cps at 25° C. ECN 1273 is an epoxy cresol novolac resin (available from Ciba). It is a solid at room temperature and has a softening point of 32°–42° C. ECN-9495 is also an epoxy cresol novolac resin (available from Ciba). It has a softening point of approximately 85°–100° C. The caprolactone triol used is TONE® 0301 (available from Union Carabide). The UVR-6105 and UVI-6974 are described elsewhere.

The viscosity of such high viscosity materials such as EPON HPT® 1050 can be determined by measuring the time for an object having a particular density to drop a measured distance into the viscous material. For the EPON HPT® 1050 a 130 g 316 stainless steel rod having a diameter of 9.54 mm was placed on the surface of the resin. The time required for the vertical rod to drop 2 cm into the resin was approximately 30 seconds at 23.5° C. From this measurement the viscosity was determined.

TABLE 3

| | Slow Cure Epoxy Trials | | | | |
|---|---|---|---|---|---|
| | Heloxy 67 Mix % | DEN 431 Mix % | EPON 1050 Mix % | ECN 1273 Mix % | ECN 9495 Mix % |
| Cyracure Resin UVR-6105 | 69.00 | 69.00 | 69.00 | 69.00 | 69.00 |
| Caprolactone Triol | 10.00 | 10.00 | 10.00 | 10.00 | 10.00 |
| Slow Cure Epoxy | 18.00 | 18.00 | 18.00 | 18.00 | 18.00 |
| UVI-6974 | 3.00 | 3.00 | 3.00 | 3.00 | 3.00 |
| Total | 100.00 | 100.00 | 100.00 | 100.00 | 100.00 |
| | 333/364 | 333/364 | 333/364 | 333/364 | 333/364 |
| Ec (mJ/cm$^2$) | 23.04 | 11.73 | 10.79 | 14.86 | 13.38 |
| Dp (mils) | 5.45 | 4.69 | 4.86 | 5.61 | 6.09 |
| E$_{10}$ (mJ/cm$^2$) | 144.29 | 98.84 | 84.51 | 88.37 | 69.16 |
| Equal Thick. Temp/Time Area | 151 | 86 | 87 | 66 | 82 |

Each sample having the composition as listed in Table 3 was mixed and allowed to equilibrate to room temperature. The samples were poured into petri-dishes and then exposed in a step wedge pattern giving different exposures over a 0.5 inch square area. The exposures were made using an argon-ion laser beam, operating over a wavelength range of 333–364 nm, and having a diameter of approximately 127 μm (1/e$^2$). The beam was scanned in a parallel line scan with each line approximately 0.002 inches apart. After fifteen minutes, the squares were removed from the petri-dish and the thickness of each square was measured with calipers. The exposure parameters $E_c$ and $D_p$ were calculated by means well established in the art of solid imaging. The value of $E_{10}$ is the exposure necessary to produce a layer of approximately 0.01 inches thick. In all cases, the higher viscosity solutions (increasing from left to right) had significantly better image resolution.

Next, new petri-dish samples of the above compositions were poured out and each was exposed with the $E_{10}$ exposure over a one inch square area. The temperature\time response of each sample was recorded using a Linear Laboratories Model C-600 E Infrared Thermometer coupled to a chart recorder. The equal thickness temperature\time area is the area under the curve for the first 1.5 minutes after the start of each exposure. Each exposed square was immediately removed (after the 1.5 minute wait) and felt for initial green strength. By feel, after the first 1.5 minutes, the EPON 1050 sample had the greatest initial green strength, with ECN 1273, ECN 9495,-DEN 431, and Heloxy 67 having lesser initial green strength in order of greatest to least. The inventors have found that this "feel" of initial green strength after approximately 1.5 minutes, correlates well with reduced unsupported layer distortion during object manufacture using a Solid Imaging process.

Based upon the findings above, it is preferred to comprise a slow curing high viscosity epoxy in the formulation, at a level of approximately 5 to 25% by weight, in order to achieve greater initial green strength as well as good interlayer adhesion and reduction of stress during fabrication of objects using the Solid Imaging process. The preferred viscosity range for this slow curing epoxy is above 1000 poise at 25° C. However, it is more preferred to use a slow curing epoxy with a viscosity above 1000 poise at 25° C. and a softening point below 40° C.

Example 4

This example illustrates the selection of the photoinitiators.

Tables 4 lists the extinction coefficients for Irgacure 2959 (2959), Irgacure 184 (184) and UVI-6974 (6974) for the major wavelengths produced by the argon ion laser, 333, 351 and 364 nm.

TABLE 4

| Material | Wavelength | Extinction Coeff. | Free radical/Photoacid Extinct. Coeff. Ratio | 351 nm Normalized Extinction Coefficient Ratio |
|---|---|---|---|---|
| IR-2959 | 351 | 66 | 0.09 | 1.00 |
| IR-2959 | 364 | 12 | 0.14 | 1.57 |
| IR-184 | 351 | 33 | 0.04 | 1.00 |
| IR-184 | 364 | 19 | 0.22 | 4.98 |
| UVI-6974 | 351 | 752 | | |
| UVI-6974 | 364 | 87 | | |

Where IR2959 is Irgacure 2959, IR-184 is Irgacure 184

Comparing the 351 nm Normalized Extinction Coefficient Ratios between those of Irgacure 2959 and Irgacure 184 it can be seen that if a formulation is optimized for use at 351 nm in terms of free radical generation and acid generation upon exposure, the Irgacure 2959 will have a similar free radical generation and acid generation performance upon exposure to 364 nm light. However, the Irgacure 184 will have a significantly higher free radical generation and a significantly lower acid generation upon exposure to 364 nm light. The preferred Normalized Extinction Coefficient Ratio between at least two major wavelengths from an exposure source for a formulation is less than a factor of 3. Even more preferred is a Normalized Extinction Coefficient Ratio which is less than a factor of 2.

Example 5

This example illustrates the preferred photohardenable composition of the present invention. Two formulations are given. The difference in the formulations is related to the combination of free radical photoinitiators and sensitizers selected. Although the matching of initiator activity is illustrated in composition 1, use of the more efficient sensitizer, 1,12-benzoperylene makes possible the efficient use of Irgacure 184 as the free radical initiator. It is believed that such a combination is better since the benzoperylene competes well with the Irgacure 184 in terms of absorption at 364 nm and leads to the generation of a higher concentration of acid from this energy, which in effect provides a similar free radical to acid ratio at both 351 nm and 364 nm.

| Composition listed by weight percent | |
|---|---|
| COMPOSITION I | |
| Sensitizer: Hexatriene/Free Radical Initiator: Irgacure 2959 | |
| Cyracure Resin UVR-6105 | 30.26 |
| Cyracure Resin UVR-6128 | 25.00 |
| EPON 1050 | 10.00 |
| Tone 301 | 10.13 |
| Irgacure 2959 | 2.70 |
| SR-351 | 12.00 |
| Caprolactone Acrylate | 7.00 |
| UVI-6974 | 2.15 |
| Distilled Water | 0.75 |
| 1,6-Diphenyl-1,3,5-Hexatriene | 0.0035 |
| Total | 100.00 |
| 6128 Epoxy Equivalent weight Value | 210 |
| 6105 Epoxy Equivalent Weight Value | 135 |
| EPON 1050 Equivalent Weight Value | 179 |
| Epoxy Equivalent Weight Ratio | 3.5 |
| COMPOSITION 2 | |
| Sensitizer: Benzoperylene/Free Radical initiator Irgacure 184 | |
| Cyracure Resin UVR-6105 | 33.07 |
| Cyracure Resin UVR-6128 | 25 |
| EPON 1050 | 10 |
| Tone 301 | 10.98 |
| Irgacure 184 | 2 |
| SR-351 | 10 |
| Caprolactone Acrylate | 6 |
| UVI-6974 | 2.15 |
| Benzoperylene | 0.02 |
| Distilled Water | 0.75 |
| Total | 100 |
| 6128 Epoxy Equivalent Weight Value | 210 |
| 6105 Epoxy Equivalent Weight Value | 135 |
| EPON 1050 Equivalent Weight Value | 179 |
| Epoxy Equivalent Weight Ratio | 3.5 |

What is claimed is:

1. In an improved photohardenable composition composed of a cationically polymerizable and free radical polymerizable organic substance, a photo-generated acid precursor, a sensitizer for the photo-generated acid precursor and a free radical polymerization initiator wherein the improvement comprises:

a) a mixture of photopolymerizable resins consisting essentially of at least two epoxy resins one of which polymerizes at a slower rate and has a higher neat viscosity than at least one other epoxy resin present and the epoxy resins are present at a concentration in the mixture of from 5 to 25% by weight, and at least one monoacrylic monomer and at least one multi-acrylic monomer wherein the concentration of the monoacrylic monomer is from 0.12 to 0.90 parts by weight that of the multiacrylic monomer and wherein the ratio of the weight of the epoxy resins to that of the acrylic monomers is between 3 to 10; and b) a combination of a free radical initiator and a photo-generating acid precursor characterized by optical molar extinction coefficients and optimized for use with a multi-wavelength argon ion laser operating in the UV and producing two major wavelengths of 351 nm and 364 nm such that a normalized ratio of the extinction coefficients of the precursor and the initiator at one major wavelength is less than 3 times the ratio of extinction coefficient at a second major wavelength.

2. A method for accurately fabricating an integral three dimensional article having improved green strength by controlling the diffusion of photoactivated molecular species in the regions of a photohardenable liquid composition exposed to actinic radiation, the method comprising the steps of:

(a) forming a layer of the photohardenable liquid composition;

(b) imagewise exposing areas of at least a portion of the layers to actinic radiation at wavelengths of 351 nm and 364 nm;

(c) introducing a new layer of liquid on to the layer previously exposed imagewise in step (b);

(d) imagewise exposing at least a portion of the new liquid layer to actinic radiation, wherein the improvement comprises use of photohardenable liquid composition comprising:

a) a mixture of photopolymerizable resins consisting essentially of at least two epoxy resins one of which polymerizes at a slower rate and has a higher neat viscosity than at least one other epoxy resin present and the epoxy resins are present at a concentration in the mixture of from 5 to 25% by weight, and at least one monoacrylic monomer and at least one multi acrylic monomer wherein the concentration of the monoacrylate monomer is from 0.12 to 0.90 parts by weight that of the multi-acrylate monomer and wherein the ratio of the weight of the epoxy resins to that of the acrylic monomers is between 3 to 10; and b) a combination of a free radical initiator and a photo-generating acid precursor characterized by optical molar extinction coefficients and optimized for use with a multi-wavelength argon ion laser operating in the UV and producing two major wavelengths of 351 nm and 364 nm such that a normalized ratio of the extinction coefficients of the precursor and the initiator at one major wavelength is less than 3 times the ratio of extinction coefficient at a second major wavelength.

* * * * *